(12) United States Patent
Ramm et al.

(10) Patent No.: US 9,376,747 B2
(45) Date of Patent: Jun. 28, 2016

(54) METHOD FOR MANUFACTURING A TREATED SURFACE AND VACUUM PLASMA SOURCES

(75) Inventors: Juergen Ramm, Maienfeld (CH); Beno Widrig, Bad Ragaz (CH); Denis Kurapov, Walenstadt (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 928 days.

(21) Appl. No.: 12/740,456

(22) PCT Filed: Nov. 1, 2007

(86) PCT No.: PCT/EP2007/061805
§ 371 (c)(1),
(2), (4) Date: Aug. 9, 2010

(87) PCT Pub. No.: WO2009/056173
PCT Pub. Date: May 7, 2009

(65) Prior Publication Data
US 2010/0291320 A1     Nov. 18, 2010

(51) Int. Cl.
*C23C 14/00* (2006.01)
*C23C 14/32* (2006.01)
*C23C 14/54* (2006.01)
*C23C 14/35* (2006.01)
(Continued)

(52) U.S. Cl.
CPC ............. *C23C 14/54* (2013.01); *C23C 14/0036* (2013.01); *C23C 14/228* (2013.01); *C23C 14/35* (2013.01); *C23C 14/351* (2013.01); *H01J 37/32009* (2013.01); *H01J 37/32055* (2013.01); *H01J 37/32477* (2013.01); *H01J 37/32541* (2013.01)

(58) Field of Classification Search
CPC .... C23C 14/54; C23C 14/228; C23C 14/0036
USPC ....................................... 204/192.38
See application file for complete search history.

(56) References Cited

U.S. PATENT DOCUMENTS

| 4,038,171 A | 7/1977 | Moss et al. | |
|---|---|---|---|
| 4,859,909 A * | 8/1989 | Gualandris | H01J 27/16 313/230 |
| 5,103,766 A | 4/1992 | Yoshikawa et al. | |

(Continued)

FOREIGN PATENT DOCUMENTS

| DE | 4306611 A1 | 9/1994 |
| EP | 1628323 A2 | 2/2006 |

(Continued)

OTHER PUBLICATIONS

International Search Report for PCT/EP2007/061805 dated Jul. 22, 2008.

(Continued)

*Primary Examiner* — Ibrahime A Abraham
(74) *Attorney, Agent, or Firm* — Pearne & Gordon LLP (57) ABSTRACT

When treating workpiece or substrate surfaces with the help of a vacuum plasma discharge between an anode and an cathode and whereby due to such treatment a solid is formed and deposited on the anode surface, which solid has a higher specific DC impedance than the specific DC impedance of the anode material, at least parts of the anode surface are shielded from such deposition by establishing thereat a shielding plasma.

16 Claims, 8 Drawing Sheets

(51) Int. Cl.
   *C23C 14/22*     (2006.01)
   *H01J 37/32*     (2006.01)

(56) References Cited

U.S. PATENT DOCUMENTS

| | | | |
|---|---|---|---|
| 5,268,056 A | 12/1993 | Kishi et al. | |
| 5,518,597 A | 5/1996 | Storer et al. | |
| 5,605,637 A | 2/1997 | Shan et al. | |
| 6,010,636 A * | 1/2000 | Donohue et al. | 216/71 |
| 6,446,572 B1 | 9/2002 | Brcka | |
| 6,495,000 B1 | 12/2002 | Atkinson et al. | |
| 6,967,305 B2 * | 11/2005 | Sellers | 219/121.54 |
| 2003/0106643 A1 * | 6/2003 | Tabuchi et al. | 156/345.35 |
| 2004/0118678 A1 * | 6/2004 | Hartig | 204/298.07 |
| 2007/0034501 A1 | 2/2007 | Bender | |
| 2008/0063811 A1 * | 3/2008 | Wang | B05D 1/62 |
| | | | 427/569 |
| 2008/0067057 A1 * | 3/2008 | German | 204/192.1 |

FOREIGN PATENT DOCUMENTS

| | | |
|---|---|---|
| JP | 02-011754 A | 1/1990 |
| JP | 07-300670 A | 11/1995 |
| JP | 2001-164360 A | 6/2001 |

OTHER PUBLICATIONS

Written Opinion for PCT/EP2007/061805 dated Jul. 22, 2008.

* cited by examiner

METHOD FOR MANUFACTURING A TREATED SURFACE AND VACUUM PLASMA SOURCES

DEFINITION

We understand under a DC plasma discharge a plasma discharge which is electrically supplied by an electric signal, the frequency spectrum thereof comprising a DC component. The addressed DC component is substantial for the signal in that it is not vanishing and has a value of at least 10 V if the addressed signal considered is a voltage and at least 10 A if the signal considered is a current. The addressed definition departs from signal consideration in frequency domain. If in time domain the addressed signal is e.g. pulsating, then such pulsating is offset with respect to the zero value by the addressed DC component.

We understand under the specific DC impedance the impedance of a material or its resistivity $\rho$ e.g. in $\Omega$m with respect to an electric signal having exclusively a DC frequency component.

We understand under DC impedance a resistance R e.g. in $\Omega$.

We understand under an anode with respect to a cathode an electrode which is operated at an electric potential containing a DC frequency component which is higher than such electric potential of a second electrode, the cathode, so that an electric DC field and thus an electric DC voltage results in direction from the anode to the cathode.

We understand under the plasma impedance the impedance which is present between the anode body and the cathode body during operation of the plasma discharge.

We understand under a low DC voltage plasma discharge a plasma discharge which is sustained with a discharge voltage containing a DC frequency component of at most 200 V and by which high DC discharge currents are established of at least 50 A.

The present invention departs form problems which occur whenever substrates are coated with the help of a DC plasma discharge between a cathode and an anode, whereby there is generated, during processing, a solid in the processing space.

If the specific DC impedance of such solid is higher than the specific DC impedance of the metal of the anode surface, deposition of such solid on the anode surface leads to an increase of DC impedance for a current transiting through such surface.

This DC impedance significantly contributes to the DC plasma discharge impedance. Its time variation, due to such deposition, results in a respective time variation of the plasma discharge characteristics.

Time variation of the characteristics of the plasma discharge reduces reproducibility of the addressed surface treatment. Additionally and if such time variation occurs inhomogeneously along the anode surface this may have a negative impact upon the homogeneity of surface treatment considered along the extent of a surface to be treated with the help of the plasma discharge.

The influence of a DC impedance increase, due to the addressed deposition, becomes the more pronounced, the smaller than the plasma discharge DC impedance is. Small plasma discharge DC impedances are especially encountered at low DC voltage plasma discharges, as e.g. at cathodic arc discharges or plasma discharges which are generated with the help of electron emitter cathodes, such as with the help of hot filament cathodes.

In spite of the fact that the addressed problems in context with solid deposition are primarily encountered when operating respective physical vapour deposition PVD or plasma enhanced chemical vapour deposition PECVD processes, they may also occur when performing DC plasma enhanced reactive etching of surfaces.

E.g. operating a cathodic arc discharge according to the WO 2006 099758 with a discharge current of 100 A results, in dependency from the pressure of a gas or gas mixture within the vacuum recipient, the type of such gas or gas mixture and the material of the evaporated cathode, in a discharge voltage between 20V and 40 V. Thereby, heating up of the anode during operation may easily lead to a discharge voltage doubling. In practice the resulting instability of the plasma discharge characteristics due to such anode heating is counteracted either by operating the wall of the vacuum recipient on anode potential, so as to establish a large anode surface which results in reduced current densities and thus in reduced heating or by construing the anode of a thermally highly conductive metal as of copper and applying an efficient cooling to the anode as by a liquid cooling medium e.g. by water.

The U.S. Pat. No. 5,518,597 addresses substrate coating with oxides by means of cathodic arc evaporation. The problem due to deposition of a respective solid- an oxide-upon the anode surface is dealt with by providing the anode as an arrangement of rods or wires which are heated up to temperatures of over 800° C.

According to the U.S. Pat. No. 5,103,766 a cathodic arc discharge is operated with two electrodes each of which being alternatively operated as a cathode and as an anode.

The approach according to the U.S. Pat. No. 5,518,597 necessitates substantial heating of the anode surface. This is disadvantageous under different aspects: The addressed heating of the anode surface accords with applying additional thermal energy to the processing and is problematic when surfaces are to be treated which are temperature sensitive. Further, due to the high temperature which results at the anode surface, latter is consumed at a rather high rate e.g. by oxidation. Therefore, the anode operated under such conditions is to be frequently replaced. Still further the anode surface may hardly be heated up homogeneously and a relatively long time span must be waited up to reaching an at least sufficient homogeneity of temperature distribution along this surface. Such relatively long time span during which thermal equilibrium is not reached has a negative impact on the overall efficiency of processing. Inhomogeneous temperature distribution along the anode surface has further a negative impact upon homogeneity of the treatment along a surface to be treated.

A disadvantage of the approach according to the U.S. Pat. No. 5,103,766 is that the contamination rate of the electrode surface which is momentarily operated as an anode surface and thus the maximum time span during which the addressed electrode may be operated continuously as an anode, is highly dependent from the partial pressure of the reactive gas which is present in the processing space, as from partial pressure of oxygen, as well as from the magnetic field at the cathode surface and, especially, from the arc current. Thus, the anode-to-cathode switching-over frequency depends from highly important process parameters, i.e. from reactive gas and its partial pressure and from arc current. This makes the overall process control critical. Further, only one of the two electrodes, both of which are conceived to operate as a cathode and thus are of material to be evaporated, is operated as a cathode at a time. This results in the fact that the overall process is operated just at 50% of the installed source evaporation capability.

It is an object of the present invention to provide a manufacturing method for treated surfaces and vacuum plasma sources by which the initial anode surface DC impedance for transiting discharge currents is substantially maintained and—if at all significant—a time variation thereof rapidly disappears after starting processing.

Such object is resolved according to the present invention under a generic aspect a):

By a method for manufacturing a treated surface which comprises providing a processing space within a vacuum recipient, therein a cathode and an anode with a metal anode surface, the metal establishing for a first specific DC impedance. There is established in the processing space an atmosphere of a gas or of a gas mixture at a desired pressure or, respectively, at desired partial pressures. A plasma discharge is generated in the processing space by applying between the anode and the cathode an electric supply signal which comprises a DC spectral component as was addressed under "Definition". The surface to be treated is treated with the help of the plasma discharge. Thereby a solid is generating in the processing space which has a second specific electric DC impedance which is higher than the first specific DC impedance. At least one area of the anode surface is established which is shielded from the solid. This is done by generating a distinct shielding plasma on this area having an extent substantially limited to such area.

In operation the shielding plasma as generated according to the present invention is normally visible as a bright glowing volume distinct from its surrounding.

It is highly astonishing that by generating the addressed plasma upon selected areas of the anode surface such areas are efficiently shielded from being contaminated by solid deposition. Thereby, these surface areas are maintained of the the anode metal during processing, thereby ensuring a very low and time invariant DC impedance for discharge currents during the overall surface treatment. Even if areas of the anode surface adjacent and remote from the selected area to be shielded become electrically isolated by the solid with a high specific DC impedance during operation, there is established by the addressed shielding plasma and at the addressed selected areas of the anode surface a low DC resistance bypass which will take over the discharge current right from the beginning of the processing. Thereby the characteristics of the plasma discharge provided for the surface treatment are kept stable.

b1):

In one mode of operating the method according to the present invention under its generic aspect a) the shielding plasma is generated by tailoring the addressed at least one area to be shielded as the surface area of a cavity in the anode surface, such cavity having an opening exposed to the processing space. The shielding plasma is generated in the cavity exclusively by respectively dimensioning the cavity fitted to the prevailing processing parameters applied, e.g. gas or gas mixture, pressure or, respectively partial pressures, solid material freed in the processing space, plasma discharge characteristics.

Thus under this mode b1) all desired processing parameters are set and due to fitted dimensioning of the addressed cavity, the shielding plasma is automatically established. The fitted or appropriate dimensioning of the cavity may be experimentally found as will be described.

This mode b1) of operation has the significant advantage that the shielding plasma is generated without applying additional energy. Further one and the same anode may thereby be exploited for processings with different processing parameters. This is achieved by providing in the anode surface more than one geometrically differently tailored cavities. Automatically that or those cavities will be activated with a shielding plasma the geometric dimensioning thereof fitting to the momentarily established set of processing parameters.

b2):

In another mode of operating the manufacturing method according to the present invention and under the generic aspect as of a) the area to be shielded is established as the surface area of a cavity in the anode surface having an opening exposed to the processing space. The shielding plasma in the cavity is generated by generating a magnetic field in the cavity. This mode b2) of operation has the advantage that the anode and thereby the surface of the anode may be conceived for different processing parameter sets for desired surface treatments, i.e. for different gases or gas mixtures, pressures or, respectively, partial pressures, solids freed in the processing space, characteristics of the plasma discharges which are to be exploited to perform different surface treatments. The shielding plasma is ignited in the at least one cavity by the magnetic field generated therein which further opens the possibility to controllably switch a shielding plasma on and off by appropriately varying the magnetic field in a respective cavity.

b3)

Still in a further mode of operating the method according to the present invention under its generic aspect as of a) the area to be shielded is established as the surface area of a cavity in the anode surface having an opening exposed to the processing space. The shielding plasma is established in the cavity by inletting at least a part of the gas or of the gas mixture which is provided for the surface treatment through the cavity into the processing space. This mode b3) of operation has the advantage that measures which are necessarily provided for surface treatment processing, namely gas flow into the processing space, are simultaneously exploited to establish in the cavity the shielding plasma. Equally to mode b2) the cavity in the anode surface may be geometrically dimensioned substantially independently from a specific set of processing parameters. An additional advantage of this mode is that if the gas or gas mixture injected through the cavity into the processing space comprises a reactive gas to be activated in the plasma discharge established between the anode and the cathode, such reactive gas is already activated in the shielding plasma. It must be stated, that exploiting an additional activation of a reactive gas by flowing such gas through the shielding plasma may be performed in all modes of operating the method according to a).

Whether or not in a cavity the gas flow establishes a shielding plasma may be controlled by adjusting the gas flow through the cavity into the processing space and/or the gas mixture.

b4)

A further mode of operating the manufacturing method according to the invention under its generic aspect as of a) is by the establishing the at least one area to be shielded as a surface area of gas inlet opening in the anode surface and exposed to the processing space. The shielding plasma in the area of the at least one gas inlet opening is established by injecting at least a part of the gas or gas mixture which is exploited for the surface treatment through the inlet opening. The distinct shielding plasma is generated adjacent to and around the inlet opening on the anode surface. This mode of operation has, similarly to mode b3), the advantages of exploiting a gas inlet which is necessary for the surface treatment additionally for establishing the shielding plasma and that, if the gas inlet comprises a reactive gas, such reactive gas is already activated in the shielding plasma. A further advantage is that there is no need of working specific cavities into the anode surface, but merely a tube arrangement in the anode for supplying the addressed gas. In this mode too, whether around a specific inlet opening a shielding plasma is generated or not may be controlled by varying gas flow and/or gas mixture inlet at a inlet opening considered.

As was addressed above, valid for all embodiments a) to b4), a low DC impedance for the discharge current is established at the areas whereat the shielding plasma is generated. Other anode surface areas, remote from the addressed shielded areas, become covered with the solid. Such remote areas become rapidly inactive with respect to the discharge current. Therefore c1):

in one mode of operating the manufacturing method of one of any modes a) to b4) the anode surface is established to substantially consist of areas which are maintained active during processing and thus of areas whereat a shielding plasma is or may be established during processing. By the term "substantially" in this context we address that although the anode surface in fact consists of the addressed at least one area to be shielded it shall not be excluded that some minor areas of the anode surface are present, whereupon there is no shielding plasma or whereupon the shielding plasma has a negligible low intensity. Thus, at least 90% of the anode surface consist of the at least one area to be shielded.

c2):

In a further mode of operating the manufacturing method according to all already addressed modes a) to $b_4$) the anode surface has an extended surface area which is present adjacent to the at least one area which is to be shielded. By this mode flexibility is reached with respect to different surface treatments, also comprising treatments whereat no solid as addressed is generated. By the extended area a large anode surface leading to respectively low discharge current densities is established for processes as just addressed. Thereby a processing sequence may be performed comprising first processing without formation of the solid and a second processing where such solid is generated.

d):

In a further mode of operating the manufacturing method according to the present invention and according to anyone of the embodiments a) to $c_2$), more than one of the addressed areas to be shielded are provided and there is selectively established the distinct shielding plasma to a part of the addressed areas.

According to the mode b1) this may be accomplished by providing at least two cavities which are of different geometric dimensioning, so that a distinct shielding plasma will be established at the one or at the other of the addressed cavities, depending on specific sets of processing parameters as addressed above. In the mode according to b2) different magnetic fields may be applied to the respective more than one cavities so as to establish a distinct shielding plasma at the one or at the other of the cavities. As addressed above in this embodiment establishing the shielding plasma may be done in a controlled manner by respectively providing a controllably variable magnetic field to the cavities.

In the operating mode according to b3) selecting at which of the cavities the shielding plasma shall be established may be performed by establishing specific gas flows and/or flows of specific gas mixtures. The addressed selection may be done in a controlled manner by controllably varying at least one of gas flow and of gas mixture flown through the more than one cavities provided.

In the mode of operation according to b4) the addressed selection may be realized by establishing different gas flows at the more than one inlet openings and/or by inletting through the more than one inlet openings different gas mixtures. The selection may be realized in a controlled manner by controllably varying at the addressed gas flow and/or gas mixtures.

d1):

In a further mode of operating the mode as addressed under d) the selection of the specific areas to be shielded is performed automatically in dependency of the prevailing processing parameters e.g. of gas or gas mixture, pressure or partial pressures, solid freed into the processing space, discharge characteristics. Thus, with an eye on mode b1) providing differently dimensioned cavities leads to the fact that automatically that cavity or those cavities will be activated with a shielding plasma at which the geometry accords with the momentarily established process parameters.

In the mode according to b2), if at more than one cavities—which in this case may be tailored equally—different magnetic fields are established, a prevailing set of processing parameters will automatically activate those cavities with a shielding plasma, at which the prevailing magnetic field fits.

In analogy and with an eye on the operating mode according to b3) providing at e.g. equal cavities different flows and/or flows of different gases or gas mixtures will automatically lead to establishing a shielding plasma at those of the cavities where the flow and/or gas or gas mixure fits with the prevailing processing parameters.

With an eye on mode b4) when more than one gas inlets are operated with different gas flows and/or different gas composition, there will be established around that or those inlet openings the shielding plasma at which gas flow and/or gas composition fits with the momentarily prevailing process parameters.

e):

Whenever establishing the shielding plasma does not necessarily involve a gas flow from the anode surface there is nevertheless established a flow of the gas or gas mixture through the cavity and into the processing space so as to exploit the shielding plasma for activating such gas or gas mixture.

f):

In a further mode of operation and whenever at least one cavity and gas flow there through is involved, the gas or gas mixture is flown from the cavity via a pressure stage, as e.g. a nozzle, into the processing space.

g):

As was explained above, low DC voltage plasma discharges do exhibit specifically low discharge DC impedances. Therefore, these plasma discharges are especially critical with respect to deposition of the addressed solid upon the anode surface. Thus, in a further mode g) of operating the method for manufacturing according to the present invention in all of the modes as addressed above, the plasma discharge between the anode and the cathode is sustained at a supply voltage of at most 200 V and even at a supply voltage of at most 100 V.

h):

In a further mode of operation treating of the surface comprises coating.

h1):

In one mode such coating is performed with a material comprising at least one of a nitride, a boride, a carbide, an oxide of a metal.

h11):

In one mode the addressed metal comprises or consists of aluminum.

i):

In a further mode of operation, the addressed plasma discharge is established as one of a cathodic arc discharge and of a hot filament cathode discharge.

j):

Still in a further mode of operating the manufacturing method according to the invention, the anode is cooled by a cooling medium.

Having discussed the manufacturing method according to the present invention under different aspects and modes of operations it must be stated that the exact physical mechanisms which lead to the occurrence of the addressed shielding plasma are not exactly known today. We therefore refrain from giving explanations of the physical mechanisms which possibly lead to this phenomenon. To this topic attention is drawn e.g. on the article "Experimental studies of anode sheath phenomena in a Hall thruster discharge" by L. Dorf et al., Journal of Applied Physics 97, 103309 (2005).

Turning now to the vacuum plasma sources according to the present invention and as applied for performing the method for manufacturing according to the invention it must be established that merely considered from the hardware standpoint e.g. the DE 43 06 611 is to be considered. It teaches a cathode/anode arrangement, whereat the anode is formed by a box-like cavity made of plates which are operated at an anode potential. The anode cavity is provided so as to increase plasma intensity of the plasma discharge exploited for treating surfaces, namely by etching with the use of a noble gas in the processing atmosphere, or by chemical reduction of the surface to be treated as by applying an argon-hydrogen gas mixture or by operating the plasma discharge in an oxygen containing atmosphere so to finally passivate a surface having been treated.

So as to generate the intense plasma discharge from the cavity anode there is provided through the cavity a magnetic field.

A):

Under a first aspect the vacuum plasma source according to the present invention has a plasma discharge source which includes a cathode and an anode. The anode comprises an anode surface and at least two cavities in the anode surface. The smallest cross-sectional dimension of the cavity is in the range of 3 to 100 mm, the depth is about half such cross-sectional dimension.

By providing more than one cavity in the anode surface, there is established per cavity volume-unit a larger surface than when tailoring the same cavity volume by one single cavity. Thereby and in context with establishing a shielding plasma as explained above, an increased anode surface area is shielded. Further providing at least two cavities in the anode surface allows establishing selectively shielding plasmas in dependency of the prevailing sets of processing parameters at which the plasma source is operated as was discussed in context with the manufacturing method.

A1):

In a first embodiment of the addressed vacuum plasma source under A the anode surface comprises an extended surface area adjacent to the at least two cavities. As was explained in context with the invention under the aspect of manufacturing method, this allows to flexibly apply the same plasma source for processings, whereat a solid is formed in the processing space with a specific DC impedance higher than that of the anode material or whereat no such solid is formed.

A2):

In a further embodiment the anode surface of the addressed anode substantially consists of the surface of the at least two cavities. Thereby, there is established an anode of minimum volume with maximum anode surface area which is kept unaffected by the solid which is formed during a respective processing. This embodiment may be combined with any embodiment under aspect A).

A3):

In a further embodiment, the anode surface comprises a gas inlet which abuts in at least one of the at least two cavities. When establishing a respective shielding plasma in one of the cavities considered, this allows the gas inlet through the gas inlet to be activated in the shielding plasma. This embodiment may be combined with any embodiment under aspect A).

A4):

In a further embodiment the addressed at least one cavity having a gas inlet abutting therein comprises a pressure stage as e.g. a nozzle, between the gas inlet and the surrounding atmosphere of the anode surface.

Thereby dependent on the processing parameters, dimensioning of the pressure stage, flow of gas or gas mixture therethrough, composition of such mixture, a shielding plasma is developed around the opening(s) of the pressure stage and/or in the conduct(s) of such pressure stage and/or in the cavity.

A5):

In a further embodiment which may be combined with anyone of the embodiments under the aspect A) there is provided adjacent at least one of the at least two cavities a magnet arrangement which generates a magnetic field in the addressed cavity. By the magnetic field generated by such arrangement a shielding plasma may be established in the cavity largely independently from the prevailing process parameters, or a shielding plasma established at prevailing process parameters merely by the selected dimension of the cavity may be adjusted with respect to its intensity.

A51):

In a further embodiment the just addressed magnet arrangement is controllable so as to generate the magnetic field controllably variable. Thereby, at a cavity considered within the anode surface, a shielding plasma may be switched on and off or just varied in intensity by controllably varying the magnetic field.

A6):

Still in a further embodiment which may be combined with all the addressed embodiments under A) the at least two cavities in the anode surface have different geometric dimensions. Thus, a shielding plasma will e.g. be established at that or at those cavities, the geometric dimension thereof fitting with prevailing process parameters.

B):

Under a second aspect of the vacuum plasma source according to the present invention which has a plasma discharge source comprising a cathode and an anode, the anode comprises an anode surface which comprises at least one cavity and an extended surface area adjacent to the addressed at least one cavity. The cavity has dimensions as was addressed under aspect A). The vacuum plasma source with such anode may flexibly be applied for processes during which a solid is formed in the processing space with a higher specific DC impedance than the DC impedance of the anode surface material or for processing where no such solid is formed, but a large anode surface is desired so as to reduce discharge current density at the anode surface.

B1):

In one further embodiment the addressed at least one cavity in the anode surface comprises at least one gas inlet abutting there in. The advantages of such gas inlet have been discussed in context with the vacuum plasma source of the invention under the aspect A3). This embodiment may be combined with any embodiment under aspect B).

B2):

In a further embodiment the addressed cavity with the at least one gas inlet further comprises a pressure stage between the gas inlet and surrounding of the anode surface. Advantages of such embodiment have been addressed in context with the embodiment A4) of the vacuum plasma source of the invention.

B3):

In a further embodiment there is provided adjacent the at least one cavity a magnet arrangement which generates a magnetic field in the at least one cavity. The advantages which are reached by such magnetic field have already been discussed in context with embodiment A5) of the source according to the present invention. This embodiment may be combined with anyone of the embodiments grouped under aspect B).

B31):

In a further embodiment the magnet arrangement which has just been addressed is controllable so as to generate the magnetic field in the cavity controllably variable. The advantages of this embodiment have been discussed in context with aspect A51) of the source according to the present invention.

B4):

In a further embodiment the source comprises at least two of the addressed cavities in the anode surface. Advantages of more than one cavity in the anode surface have been addressed under aspect A) of the vacuum plasma source according to the present invention. This embodiment may be combined with anyone of the embodiments under aspect B).

B5):

In a further embodiment the addressed at least two cavities in the anode surface are differently geometrically dimensioned. The advantages which are reached by this embodiment have already been discussed under aspect A6) of a source according to the present invention. This embodiment may be combined with anyone of the embodiments under aspect B).

C):

Under a further aspect of the vacuum plasma source according to the present invention having a plasma discharge source which comprises a cathode and an anode, the anode comprises an anode surface with at least one cavity and a gas inlet abutting in the addressed cavity. The at least one cavity has dimensions as was addressed under A). As was further already addressed above, providing at least one cavity in the anode surface as well as a gas inlet abutting therein allows to establish a shielding plasma even if the geometric dimensions of the cavity do not fit with prevailing established either by the mere dimensioning of such cavity process parameters.

C1):

In one embodiment the cavity comprises a pressure stage between the gas inlet and surrounding of the anode surface. Thereby, in dependency of the processing parameters to be established when the vacuum plasma source is operating and the geometric dimensions of the throughopenings of such pressure stage as well as dimensioning of the cavity, gas flow and/or gas mixture, the shielding plasma is established just surrounding the opening of the pressure stage and/or within a throughhole of such pressure stage and/or in the cavity.

In any such case the injected gas or gas mixture will be activated by the shielding plasma. This embodiment may be applied in combination with all embodiments of aspect C).

C2):

Still in a further embodiment of the source it has an anode surface which comprises an extended surface area adjacent to the at least one cavity. The advantage with respect to flexibility of using the respective plasma source has already been discussed e.g. under aspect B). This embodiment may be combined with any of the embodiments under aspect C).

C3):

In a further embodiment the anode of the discharge source has an anode surface which substantially consists of the at least one cavity. The advantage of this embodiment, which may be combined with any embodiment under aspect C) is addressed e.g. under A2).

C4):

In a further embodiment there is provided adjacent the at least one cavity a magnet arrangement which generates a magnetic field in the at least one cavity. The advantages of this embodiment, which may be combined with any embodiment under aspect C) have been addressed e.g. under A5).

C41):

In a further embodiment the just addressed magnet arrangement is made controllably variable. The advantages achieved by such embodiment have been addressed under A51).

C5):

In a further embodiment the anode surface comprises at least two of the addressed cavities. The advantages of this embodiment have been addressed under A). This embodiment may be combined with any embodiment under C).

C51):

In a further embodiment the just addressed at least two cavities are differently dimensioned. The advantages of this embodiment have addressed e.g. under A6).

In a further embodiment which may be combined with any of the embodiments under the aspects A) to C) the anode and the cathode are operationally connected to an electric supply source generating an output signal which has a DC frequency component as was addressed under "Definition".

In a further embodiment the addressed DC component is a current of at least 50 A at a voltage of at most 200 V.

Still in a further embodiment which may be combined with all the embodiments addressed under the aspects A) to C) the anode is provided with a channel arrangement connected to a cooling medium supply.

Still in a further embodiment which may be combined with any previously described embodiments under aspects A) to C) the discharge source is a cathodic arc discharge source or a hot filament low voltage discharge source.

The invention shall now further be described with the help of figures and of examples.

The figures show:

FIG. 1 schematically and simplified, a vacuum treatment apparatus wherein surfaces are treated with the help of cathodic arc discharge, FIG. 2 in a representation in analogy to that of FIG. 1, a vacuum treatment apparatus wherein surfaces are treated with the help of a hot filament plasma discharge, FIG. 3 schematically, a part of an anode surface which is covered by solid material formed during known plasma-assisted processing e.g. with an apparatus according to the FIG. 1 or 2, FIG. 4 generically, the concept according to the present invention, namely of shielding at least parts of the anode surface from solid deposition by shielding plasma, FIG. 5 schematically, a part of an anode surface conceived to establish a shielding plasma according to the present invention, FIG. 6 schematically, a cross-section through a part of an anode according to the invention in a further embodiment and conceived as a testing anode or as an anode which may flexibly be applied to different processings, FIG. 7 a photography of an anode for cathodic arc discharge operation following the concept as of FIG. 6, FIG. 8 a photograph of the anode as of FIG. 6 in operation showing the occurrence of shielding plasmas, FIG. 9 a further embodiment of an anode following the concept as shown in FIG. 6, FIG. 10a, b in perspective representation, two further embodiments of anodes according to the invention, FIG. 11 schematically and in cross-section, a part of an anode in a further embodiment according to the present invention, FIG. 12 in a representation according to that of FIG. 11, a further embodiment of an anode according to the present invention, FIG. 13 still in a representation in analogy to that of FIG. 11, a further embodiment of an anode according to the present invention, FIG. 14 in a representation in analogy to that of FIG. 13, a further embodiment of an anode according to the present invention, FIG. 15 in a schematic perspective representation, a part of an anode according to the present invention in a further embodiment, FIG. 16a schematically, a cross-section through an anode according to the present invention still in a further embodiment and FIG. 16b departing from the anode as of FIG. 16, a further embodiment, whereat the addressed anode is combined with an embodiment as addressed under FIG. 6.

The following description of examples of the present invention shall be made in context with low DC voltage discharges and thereby especially in context with cathodic arc discharges and discharges making use of hot filament cathodes. Nevertheless, and as has already been addressed the invention may also be applied in context with other DC voltage plasma discharges as e.g. applied for sputtering.

Figure 1:
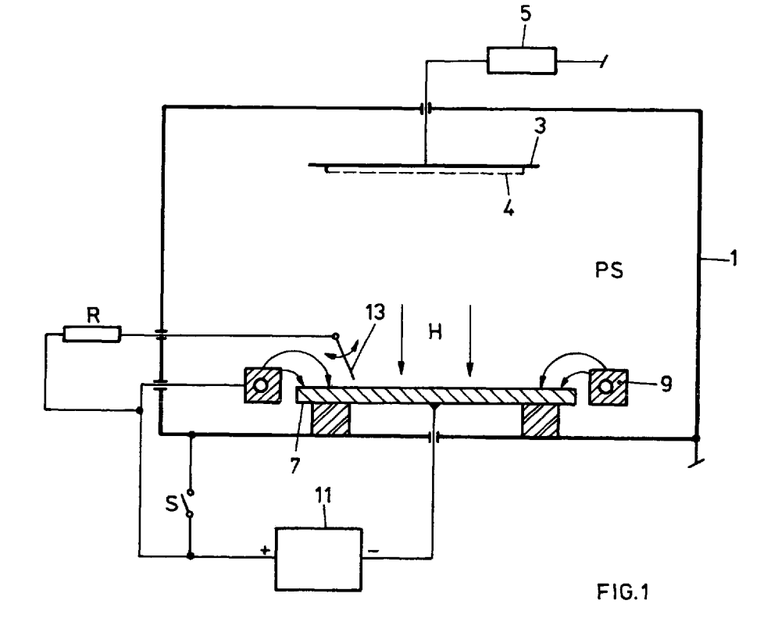

In FIG. 1 there is schematically shown a treatment apparatus with a plasma source being an arc evaporation source, as a typical example of a low DC voltage plasma source. In a vacuum recipient 1 there is provided a holder 3 for holding workpieces or substrates to be surface treated in the recipient 1. The holder 3 may be operated at a biasing voltage which is commonly a DC voltage, i.e. a voltage which comprises a DC frequency component. Thus, the biasing voltage applied by a biasing generator 5 may e.g. be a pulsating voltage which is asymmetric with respect to zero-voltage value.

The cathodic arc discharge is established between a target 7 and an anode 9. By means of an electric supply generator 11 a supply signal comprising a DC frequency component is applied to the target 7 and the anode 9. The anode 9 is operated on a higher electric DC potential than the target 7, which is, electrically, the cathode 7. The supply generator 11 generates exclusively a DC signal or a DC signal with superimposed AC, as e.g. realized by a pulsating signal which is asymmetric with respect to zero signal level.

The arc discharge is ignited as schematically shown in FIG. 1 by means of an ignition finger 13 which is e.g. via a resistance R, operated on anode potential and which is mechanically moved to contact the surface of the cathode 7 so as to draw an igniting arc.

The time course of the resulting arc, usually a multitude of arcs, may be influenced by magnetic field H applied adjacent to the cathode 7. Commonly, resulting discharge currents are between 10 A and 1000 A, whereby there result discharge voltages of between 15 V and 150 V.

The anode 9 may be operated on the same electric potential as the inner surface of the wall of the recipient 1, which is schematically shown in FIG. 1 by the switch S. Thereby, the anode surface is significantly enlarged, which leads normally to a reduction of the discharge voltage. This is an indicia for a reduced DC impedance of the plasma discharge. The plasma discharge is thereby customarily operated in a processing atmosphere in the processing space PS containing at least a working gas, normally a noble gas as especially argon.

The arrangement as schematically shown in FIG. 1 is perfectly known to the skilled artisan.

Figure 2:
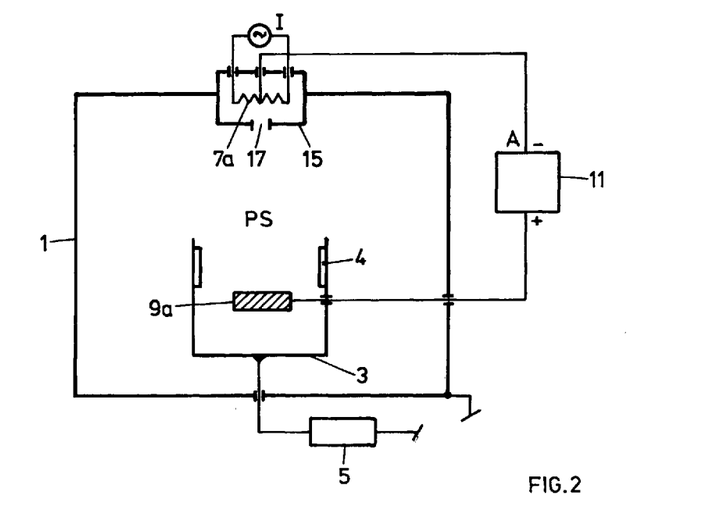

In FIG. 2 there is shown a second apparatus with a second type of low DC voltage plasma discharge source. An electron-emitting cathode 7a, realized by a filament heated by a heating current I, resides within a cathode chamber 15, the interior of which communicating with the processing space PS within the recipient 1 via an opening 17. Opposite the orifice 17 there is provided within the recipient 1 an anode 9a. Cathode 7a and anode 9a are operated by means of the electric supply generator 11. Here too, the plasma discharge between cathode 7a, through orifice 17, towards anode 9a and holder 3 is established in a processing atmosphere containing a working gas which normally is a noble gas as especially argon. In this type of plasma discharge, which shall be referred to as "hot filament" discharge, the same current and discharge voltage ranges apply as were addressed in context with the cathodic arc discharge as of FIG. 1. The arrangement of FIG. 2 is perfectly known too to the skilled artisan.

The plasma glow discharges as used for sputtering are established with a discharge current customarily between 5 and 50 A, the discharge voltages are of several hundred V. For so-called abnormal glow discharge, the discharge currents are of several hundred A, the discharge voltages of several hundred V. As was already mentioned, the present invention may also be applied to those kinds of plasma discharges, which may not be called low voltage.

In cathodic arc discharge operation as of FIG. 1 as well as in hot filament plasma operation as of FIG. 2 the surfaces of workpieces 4 may be coated with a material which has a specific DC impedance which is higher than the specific DC impedance of the metal from which the respective anodes 9a and 9 are made. In cathodic arc evaporation this may be performed by inletting into the processing space PS a reactive gas which reacts with a metal or metal compound evaporated by the arc discharge from the cathode 7. A coating which even may be a layer of electrically isolated material of an isolating material is deposited primarily on the surface of a workpiece or substrate 4 on holder 3.

In hot filament processing, no solid material is normally freed into the processing atmosphere. A reactive gas inlet into the processing space is activated by the plasma discharge and deposited upon the substrate or workpiece 4. Thereby, the resulting coating material may have a higher specific DC impedance than the specific DC impedance of the anode material up to being electrically isolating (for DC). Beside upon the substrate or workpiece 4 such solid coating material deposits also on the anode 9, 9a. Thereby, the plasma discharge DC impedance rises, leading, as was addressed in the introductory part, to an unstable behaviour of the discharge with the respective negative impact on the desired treatment result of the workpieces or substrates. The same may occur if e.g. by means of the hot filament plasma discharge workpiece surfaces are reactively etched or cleaned by means of a plasma activated reactive gas.

Normally, both the anode 9 for cathodic arc discharge as well as 9a for hot filament discharges are made of a highly conductive material, commonly of copper, and are intensely cooled.

Figure 3:
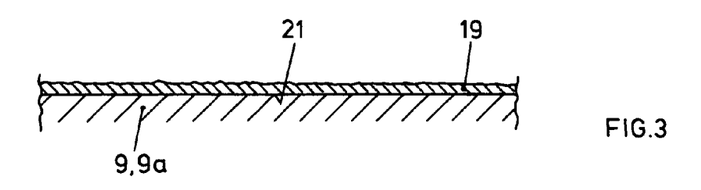

In FIG. 3 there is schematically shown a part of an anode as of 9 or 9a according to the FIG. 1 or 2 with a covering layer 19 of a solid upon the anode surface 21. Such covering layer 19, as was addressed, may result whenever during the treatment of the workpiece surface a solid is formed in the reaction space PS of the recipient. If such solid is of a material which has a specific DC impedance as low or substantially as low as the specific impedance of the material of the anode 9, 9a, such covering layer 19 will not or will only insignificantly influence the plasma discharge established for treating the workpiece surface as of the arc discharge in the embodiment of FIG. 1 or the hot filament discharge as of the embodiment of FIG. 2.

If on the other hand the addressed covering 19 is of a material which has a significantly higher specific DC impedance than the material of the anode, the occurrence of such covering and its growth over time will continuously change the addressed plasma discharge characteristics as was addressed, up to breakdown of the plasma discharge.

Figure 4:
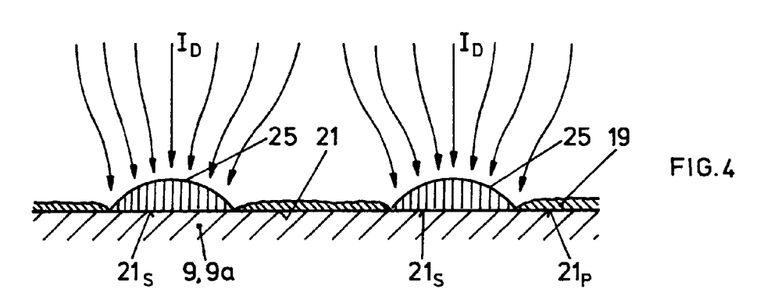

In FIG. 4 there is shown in the same schematic representation as of FIG. 3 the generic approach according to the present invention so as to avoid deposition of such solid at least upon selected surface areas 21, of the anode surface 21. According to FIG. 4 there is established along at least one area $21_S$ of the anode surface 21 a distinct shielding plasma 25, the extent of which being limited substantially to the addressed selected area $21_S$. Such distinct shielding plasma as will be exemplified later on, is visible during processing as a bright spot upon the anode surface 21. Astonishingly by means of such shielding plasma 25 along areas of the anode surface 21 the occurrence of solid deposition in these areas $21_S$ is avoided. Adjacent to the addressed areas $21_S$ the deposition of high impedance solid will nevertheless occur as shown in FIG. 4, but such deposition is electrically bridged by the high conductivity shielding plasma 25 upon the high conductivity anode surface areas $21_S$, which are substantially maintained uncontaminated and thus of a substantially unvarying anode material at substantially stable low specific DC impedance presented to the discharge current. The discharge current of the treatment plasma discharge concentrates on the low impedance areas $21_S$ as schematically shown in FIG. 4 by $I_D$.

Figure 5:
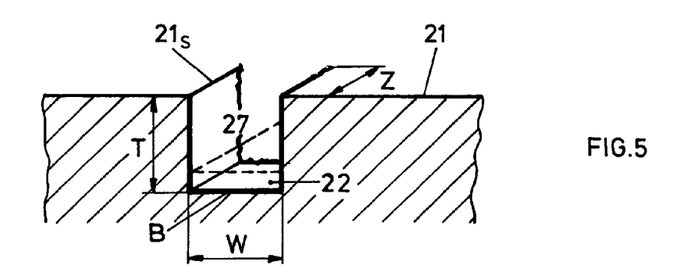

In a first embodiment to realize a shielding plasma 25 along at least one distinct area $21_S$ of the anode surface 21 as of FIG. 4 and as schematically shown in FIG. 5, the anode surface is conceived with at least one cavity 27.

The cavities addressed throughout the present description are to be understood to have a smallest cross-sectional dimension W of 3-100 mm and a depth T of at least half that dimension W. This too makes clear what is to be understood under a "cavity" in the sense of the present invention.

Thereby, in FIG. 5 the surface which borders the cavity 27 and which in FIG. 5 is drawn with a thickened line, is the area $21_S$ as of FIG. 4, whereupon or where along the shielding plasma is established.

A desired treatment of the workpiece surface as by the processings according to FIG. 1 or FIG. 2 is established by establishing a desired set P of processing parameters which comprise the gas or gas mixture type in the reaction space PS, the pressure or, respectively, the partial pressures of such gases therein, the characteristics of the plasma discharge exploited for surface treatment and, if prevailing the characteristics of a solid material which is freed into the processing space as by evaporating material from the cathode 7 in the cathodic arc discharge process.

For a given set $P_1$ of processing parameters there exists a rather narrow range of geometric dimensions for the cavity 27 as of FIG. 5, at which a shielding plasma is established in the cavity 27 and thus along the surface area $21_S$ of the anode surface 21. The cavity 27 is substantially defined by the smallest cross-sectional extent W, the longest cross-sectional extent L and depth T. Of predominant importance for establishing the addressed shielding plasma within the cavity 27 is the extent W.

Figure 6:
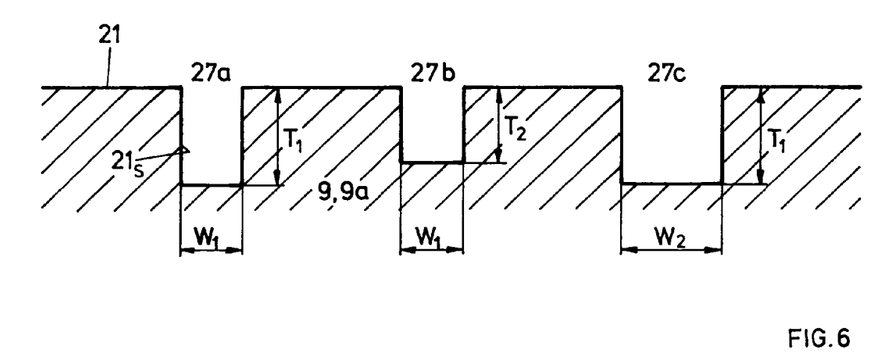

As was explained above the physical mechanism which leads to the development of a shielding plasma within cavity 27 at a distinct set $P_1$ of processing parameters is today not exactly known. Therefore, one approach to establish proper geometric dimensioning for the cavity 27 is today performed by experiment. As schematically shown in FIG. 6 there is prepared an anode 9, 9a with a set of more than one cavity 27a, 27b . . . . These cavities 27a, 27b . . . are mutually different with respect to their geometric dimension W and/or T as schematically shown. There is established a processing arrangement e.g. according to FIG. 1 or 2 with such an anode and established a desired set $P_1$ of processing parameters so as to treat a surface of substrates or workpieces in a desired manner. During operation one may visually watch at which of the different cavities 27a, 27b . . . a shielding plasma is generated. After processing this may be recognized by examining at which of the cavities no deposition of solid has occurred. Having found the one or more than one cavity at which a shielding plasma is generated at the desired set $P_1$ of processing parameters, the anode surface for subsequent processing at the addressed set $P_1$ of parameters is provided with one or more than one cavity dimensioned so that the shielding plasma is generated.

Figure 7:
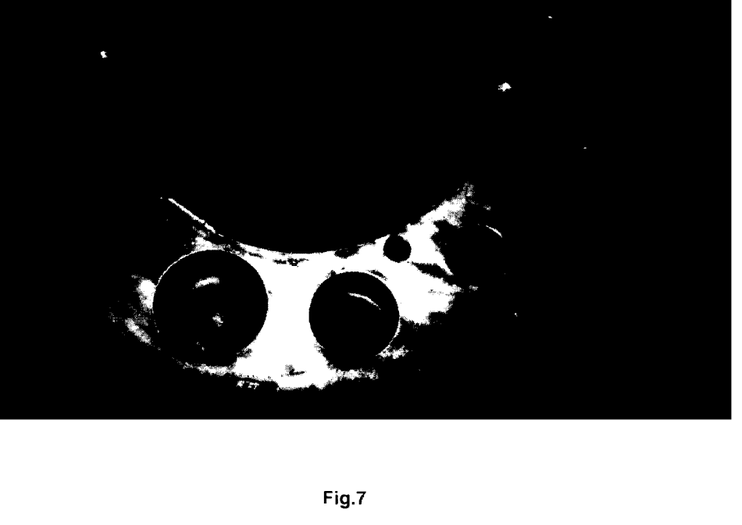

An anode which is conceived as has been schematically shown in FIG. 6 for cathodic arc discharge is shown in FIG. 7. Having cylindrical cavities, there is valid W=L. The anode surface is provided with a multitude of differently tailored cavities.

A desired treating process was established with following set processing parameters:
Cathode material:
 Aluminum (70 at %)-Chromium (30 at %)
Working gas: No argon gas flow
Reactive gas: Oxygen gas flow 400 sccm
Partial pressure of oxygen: 0.8 Pa
Discharge current: 180 A The anode as of FIG. 7 was mounted in a treatment apparatus as of FIG. 1, which was operated with the set of processing parameters as indicated.

Figure 8:
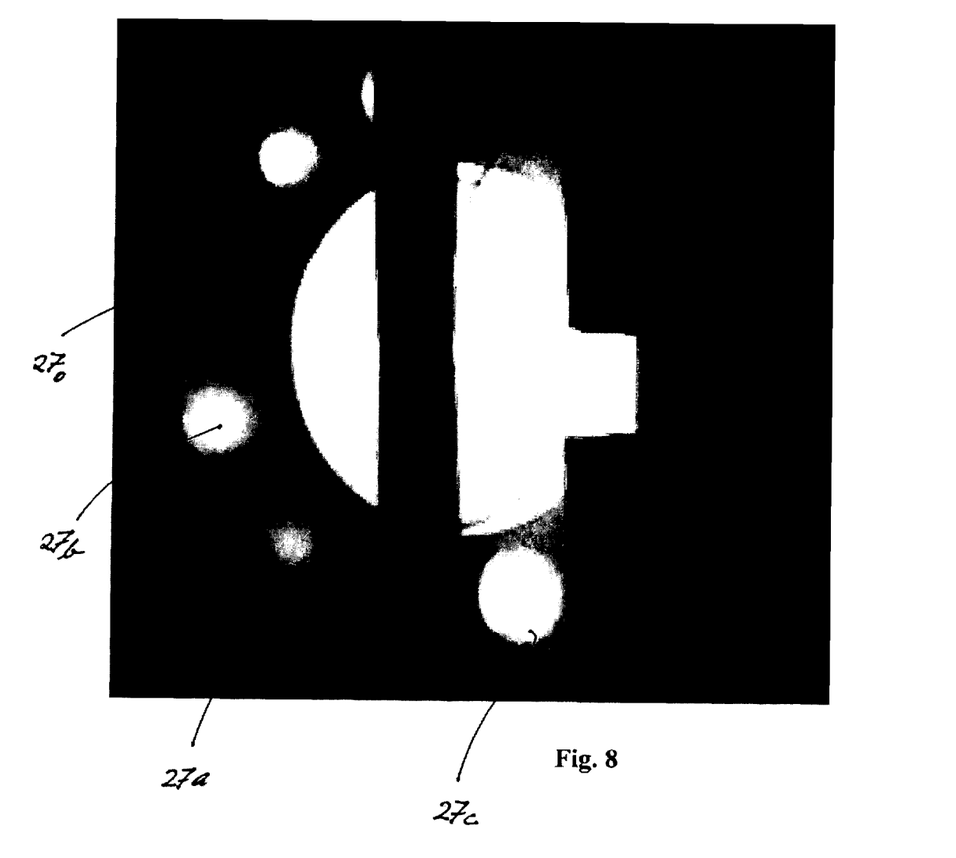

FIG. 8 shows a photograph of the anode as of FIG. 7 during processing with the addressed set of processing parameters. It may clearly be seen that at some of the cavities $27_0$ no shielding plasma is established and at others of the cavities 27a, 27b . . . shielding plasmas of different intensities. Thus, it is found which dimension W of the cavity will establish for a shielding plasma. An anode which is to be used for processing with the set of processing parameters as indicated will thus be provided with cavities of that dimensioning W which lead to shielding plasma according to cavities 27b or 27c.

Under this aspect the anode with the selection of differently dimensioned cavities as of FIG. 7 may be said to be on one hand a test anode. On the other hand such an anode may be applied when it is considered to operate processing in the respective apparatus flexibly at different sets P of processing parameters. In such a case the prevailing process with the prevailing set P of processing parameters will automatically select those cavities in the anode surface to establish a shielding plasma which fit with respect to their geometric dimensioning.

In spite of the fact that cavities with circular cross-section and opening towards the processing space PS are good embodiments because such cavities may easily be manufactured, it must be understood that the shape of such cavities is not limited to circular or cylindrical. Their cross-section may also be quadratic or square, etc. Further, and as schematically shown in FIG. 5 the cross-sectional area of the cavity may have one extent L which is substantially larger than the extent W. Thereby, such a cavity may be slit-shaped. Nevertheless, if the length extent of such a slit-shaped cavity L is made substantially larger than the extent W it may occur that a shielding plasma is established at different separate areas along the slit cavity which may not be foreseen.

By experiments with anodes having differently dimensioned cavities the trend was recognized that cylindrical cavities with increasing W establish for a shielding plasma when the total pressure of the gas or gas mixture in the processing space is lowered.

If e.g. there is established a discharge current in the range of 50 A to 200 A, an oxygen partial pressure between 0.4 Pa and 2.5 Pa, then a cylindrical cavity with diameter W of 50 mm and a depth T of 38 mm establishes for a shielding plasma in that entire processing parameter range. On the other hand a cylindrical cavity of equal depth but with a diameter W of 30 mm generates a shielding plasma only at a partial pressure of about 2 Pa. Below such partial pressure, no shielding plasma is formed. Thus, in practice the cavity will be tailored rather with a diameter of about 50 mm so as to ensure stable processing also for varying process parameters within the addressed range, i.e. to be active in a relatively large window of process parameters.

Figure 9:
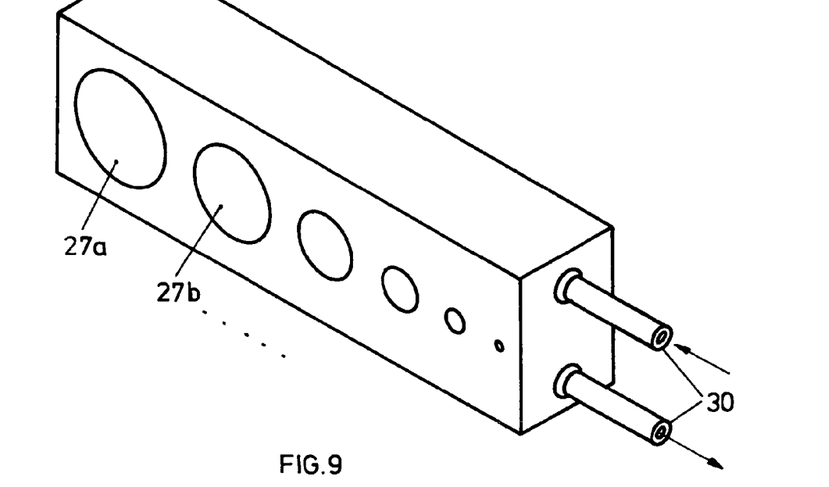

In FIG. 9 there is schematically shown an anode following the concept according to the FIGS. 6 to 8 which is shaped as a linear anode. Whereas in FIG. 7 channels for applying a cooling medium to the anode are not shown, FIG. 9 shows the in- and outlets 30 for a liquid cooling medium, normally water.

Further experiments have shown that not only the dimensions as of W, L according to FIG. 5 may be decisive for whether a shielding plasma is established in a respective cavity or not, but also the depth T. Up to now the experiments show the trend that the depth T should be selected to be approx. 50% of the smaller dimension W or larger.

Figure 10A:
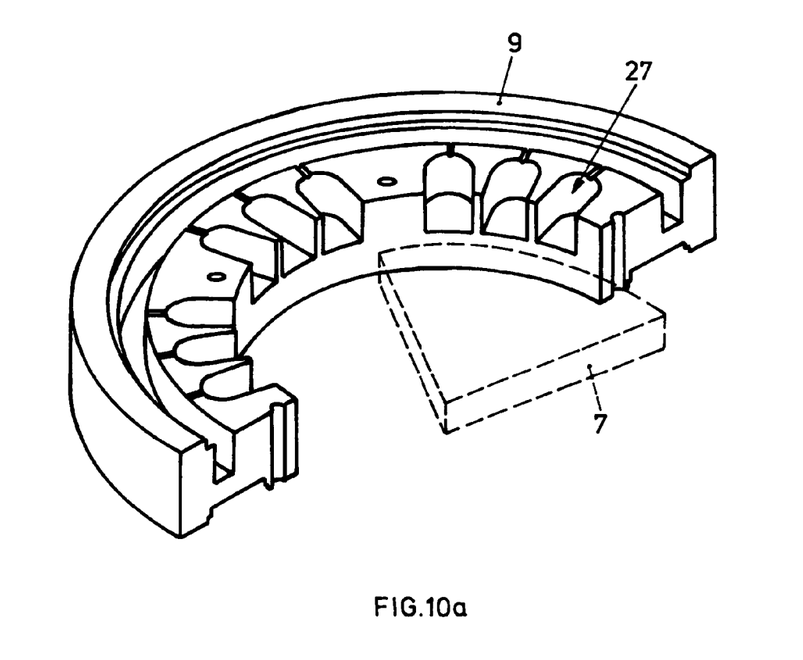
Figure 10B:
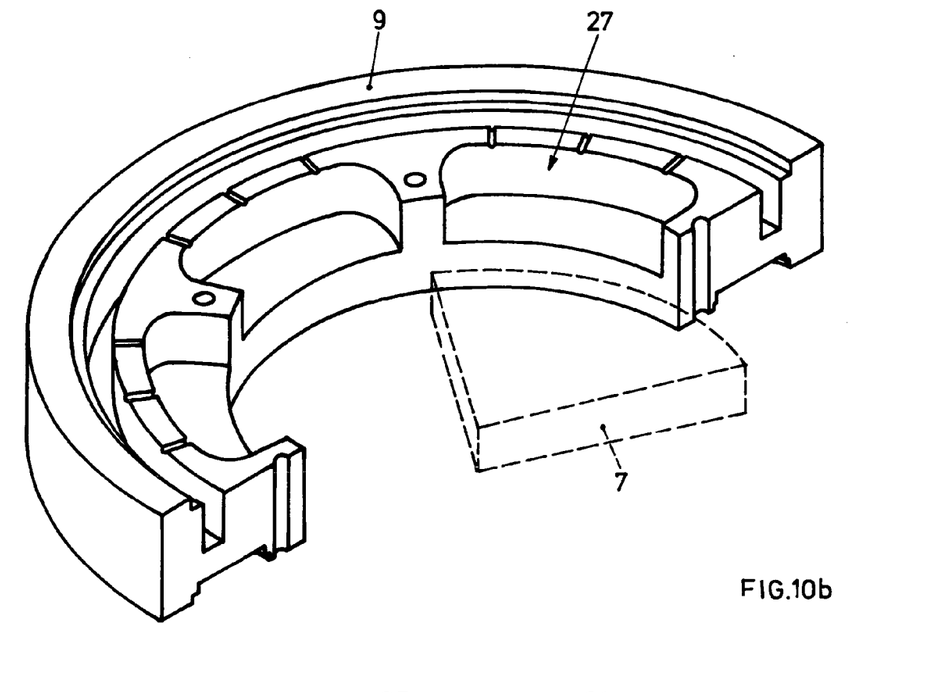

With an eye on FIGS. 5, 6, and 7 the at least one cavity is provided in that surface of the anode which is facing the processing space and the substrate holder. Nevertheless, the addressed cavity may also be applied to other anode surfaces, as shown in the FIGS. 10a and 10b at 27 for a cathodic arc evaporation anode 9.

Even if more than two equally dimensioned cavities are provided in the anode surface according to a desired set $P_1$ of processing parameters it might be that, during processing, the shielding plasma at one or the other of the addressed cavities extinguishes. This may have a negative impact upon the homogeneity of surface treatment.

One possibility to make sure that a shielding plasma is stably maintained in all of the appropriately tailored cavities is to apply onto the basis B surface of the respective cavities according to FIG. 5 an inlay 22 of a metal having a high melting point as e.g. of tantalum or tungsten. Avoiding that these inlays are efficiently cooled by the cooling system provided in the anode, leads to the fact that they are significantly heated up during processing, which ensures stable maintenance of the shielding plasma in the addressed cavity.

Further and rather preferred approaches to ensure stable shielding plasmas in all cavities as desired will be discussed subsequently in context with further embodiments.

Summarizing and up to now, generation of shielding plasma has been discussed caused by appropriate geometrically dimensioning of at least one cavity in the anode surface fitted to a prevailing set P of processing parameters. Different approaches shall now be discussed to establish a shielding plasma, which may be combined with the approach described to now.

Figure 11:
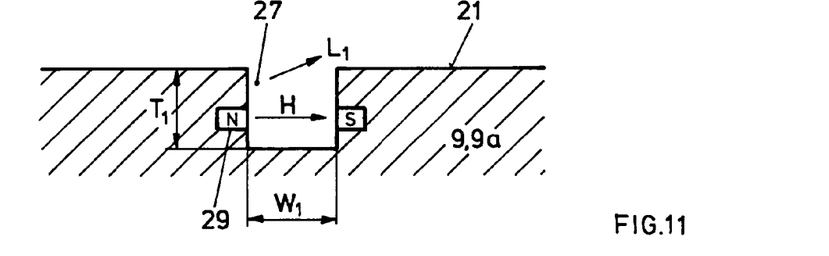

In FIG. 11 there is shown, in a representation according to that of FIG. 6, the anode surface 21 of anode 9, 9a having a cavity 27. There is established by means of a magnet arrangement 29 a magnetic field H through the cavity 27. Thereby, it may be reached, that the range of processing parameters P e.g. $W_1, L_1, T_1$ and at which at a cavity with a specific dimensioning a shielding plasma is generated, is significantly widened. On one hand stability of the occurrence of shielding plasmas may be ensured in an anode with equally dimensioned cavities fitted to a desired set of processing parameters, and, on the other hand, the cavities 27 may be geometrically tailored substantially independently from a desired set of processing parameters. By applying the addressed magnetic fields stable shielding plasmas may be generated in cavities which are not accurately tailored to fit a desired set of processing parameters. Thus, flexibility is gained to apply one and the same anode with at least one cavity to different processings with different sets P of processing parameters, nevertheless ensuring that a stable shielding plasma will be generated at the cavities.

Figure 12:
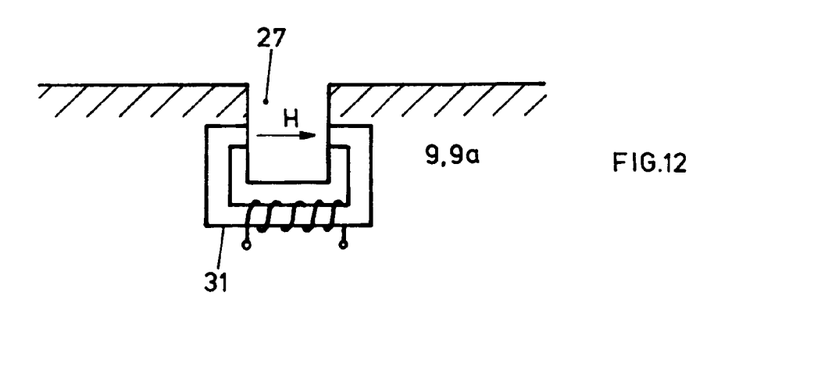

By establishing the magnet arrangement to be controllable, as schematically shown in FIG. 12 it becomes even possible to switch or control the occurrence of a respective shielding plasma by controllably varying the magnetic field H, especially if the geometric dimension of the cavity does not per se automatically lead to the generation of a shielding plasma at a prevailing process. As schematically shown in FIG. 12 this may e.g. be realized by means of establishing the magnetic field H by a controllable electromagnet arrangement 31.

In a further embodiment a shielding plasma may again be established in a cavity of the anode surface if the cavity geometry does not fit to a prevailing set P of processing parameters. This is realized, according to FIG. 13 by having at least a part of the gas or of the gas mixture which is exploited for the surface treatment through the cavity. Thereby a gas inlet 33 inlet to the processing space PS for the gas or gas mixture G is provided in the wall of the cavity 27. Similarly to the effect of providing a magnetic field as of the FIGS. 11 and 12, the range of processing parameters P for which a specific cavity 27 ensures occurrence of a shielding plasma is considerably widened. It becomes possible to flexibly apply an anode with at least one cavity 27 to different sets P of processing parameters As shown in FIG. 14 it is further possible to controllably vary flow of gas G through the cavity 27 and into the processing space PS e.g. by means of a valve 35 and/or to controllably vary the mixture of gas inlet as by valves 39. By establishing the addressed gas flow and/or gas mixture to be variable it becomes possible to control the occurrence of the shielding plasma at a cavity 27 considered.

Significant independency of occurrence of a shielding plasma from the geometric dimensioning of a cavity or, vice versa from a prevailing set of processing parameters P is thus achieved by the embodiment as it is shown in the FIGS. 11 and 14. A further improvement is reached by providing in the cavity 27, between the inlet 33 for the gas G and the processing space PS a pressure stage 41 with at least one gas injection opening 43. Dependent on the fact how large the injection opening 43 is tailored and upon gas flow rate through this opening 43 the shielding plasma is generated adjacent to the opening 43 at the surface 21 of the anode and/or in the gas conducting tubing 41a of the pressure stage 41 and/or in the cavity 27.

Figure 13:
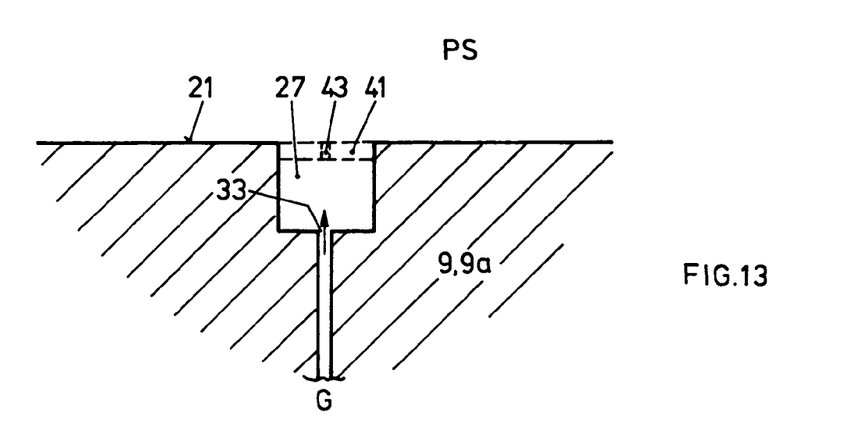
Figure 14:
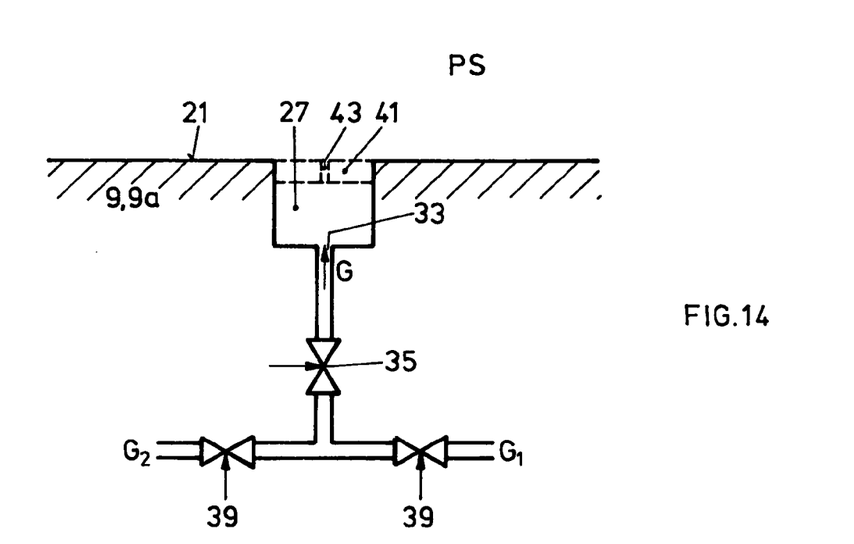
Figure 15:
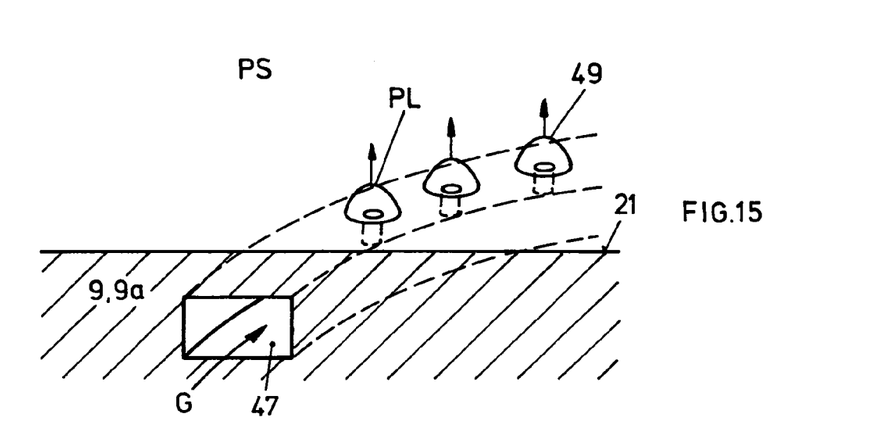

Departing from the embodiment of FIG. 13 or 14 with a pressure stage 41 provided at each of the distinct cavities 27, FIG. 15 shows schematically a further embodiment, where the cavity may be used merely for gas distribution to several outlet openings 49 towards the processing space PS. In this embodiment there is provided in the anode 9, 9a a gas distribution channel 47 by which at least a part of the gas or gas mixture which is exploited for the surface treatment is distributed to the gas outlet nozzles 49 through which the gas G is flown into the processing space PS. A shielding plasma is established as shown schematically at PL e.g. just adjacent and around the nozzle openings 49.

Normally the anodes 9, 9a are cooled by cooling medium, customarily water, which is flown along a cooling channel system in the anode (not shown).

With an eye on the FIGS. 4 to 15 it may be seen that along the anode surface there result specific areas, $21_S$ in FIG. 4, wherealong and due to the shielding plasma, no solid is deposited and remaining anode surface areas $21p$, whereupon there occurs deposition of the solid.

By establishing the anode surface to have areas $21s$ along which a shielding plasma is established and further areas $21p$ along which no shielding plasma is established, such anode may flexibly be applied e.g. to a first processing which does not incur the formation of high resistive solid. Thereby, the entire surface of the anode is exploited, leading to low discharge current density in this processing mode. Afterwards and in a further processing, whereat the addressed solid is generated, the shielding plasma is established at the predetermined area $21_S$. Thus, the anode of this type may flexibly be applied for processing without generation of the addressed solid and for processings with generation of the addressed solid.

Figure 16:
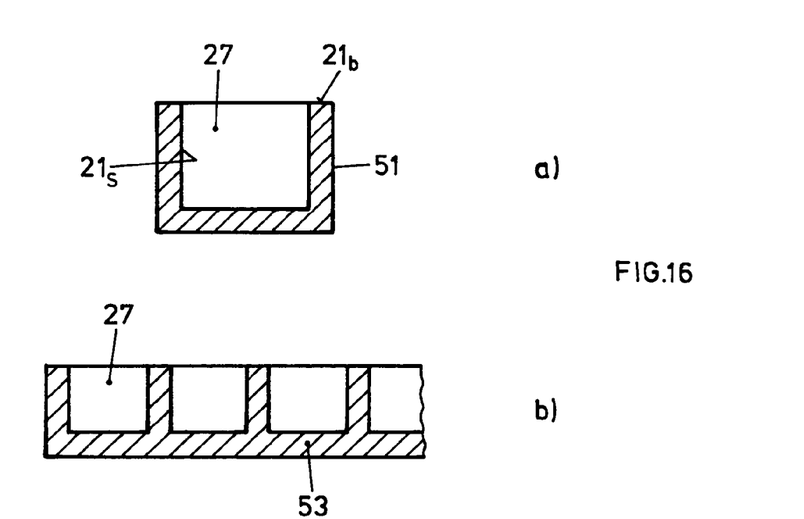

On the other hand and with an eye exclusively on processings whereat the addressed solid of relatively high specific DC impedance is formed, e.g. with an eye on FIG. 4, it may be seen that during such processing all the surface areas $21p$ of the anode which become coated with the addressed solid are inactive with respect to the discharge current. Therefore, for such a process the anode may be conceived to have an anode surface which at least substantially consists of areas $21_S$, whereat a shielding plasma is established. Such embodiments of anodes 9, 9a are schematically shown in FIG. 16a), b). According to FIG. 16a) there is provided a single cavity anode 51 so that the anode surface is at least substantially, besides of border areas at $21_b$, formed by the surface $21_S$ of the cavity 27. FIG. 16b) shows a multiple cavity anode 53 again schematically, where the anode surface substantially consists of cavity surfaces $21_S$ and thus of surfaces whereat a shielding plasma is established.

The present invention is especially suited for PVD or PECVD depositing layers on substrate or workpiece surface especially of at least one of a nitride, a boride, a carbide, an oxide of a metal, especially of aluminum or of an alloy comprising aluminum, or of mixtures thereof.

The invention claimed is:

1. A method for manufacturing a treated surface comprising
providing a processing space within a vacuum recipient, therein an anode with a metal anode surface having an extended surface with at least one cavity which cavity is open to said processing space, and wherein the smallest cross sectional width W of said cavity is between 3 mm and 100 mm and the depth T of said cavity is at least half the width W, and a cathode, said metal anode surface establishing a first specific DC impedance;
establishing in said processing space an atmosphere of a gas or of a gas mixture at a desired pressure or at desired partial pressures;
generating a plasma discharge in said processing space by applying between said anode and said cathode an electric supply signal comprising a DC component;
treating a surface with the help of said plasma discharge, thereby generating in said processing space a solid having a second specific electric DC impedance which is higher than said first specific DC impedance;
establishing at least one area of said anode surface shielded from said solid by generating a distinct shielding plasma on said at least one area, the extent of which being substantially limited to said at least one area, by generating in said cavity a variably controllable magnetic field controlled by an electromagnetic arrangement, and ensuring automatic ignition of the distinct shielding plasma in a prevailing set of process parameters in the processing space by adapting the magnetic field, wherein the prevailing set of process parameters comprises:
the smallest cross sectional width W of the cavity and the depth T of said cavity;
the atmosphere of the gas or of the gas mixture at the desired pressure or at the desired partial pressures;
the first specific DC impedance;
the electric supply signal comprising the DC component; and
the second specific electric DC impedance.

2. The method of claim 1, comprising generating in said cavity said distinct shielding plasma by inletting at least a part of said gas or of said gas mixture through said cavity into said processing space.

3. The method of claim 1, comprising generating said shielding plasma by injecting at least a part of said gas or of said gas mixture through at least one inlet opening in said anode surface into said processing space, said distinct shielding plasma comprising a plasma adjacent and around said at least one inlet opening on said anode surface.

4. The method of one of claims 1 to 3, further comprising establishing said anode surface at least substantially by said at least one area to be shielded.

5. The method of claim 1, further comprising providing said anode surface with an extended area adjacent to said at least one area to be shielded so as to flexibly perform a treatment of a surface during which said solid is not produced.

6. The method of claim 1, further comprising providing more than one of said areas to be shielded and selectively establishing said distinct shielding plasma to a part of said more than one areas to be shielded.

7. The method of claim 1, further comprising flowing at least a part of said gas or gas mixture through at least one of said at least one cavity into said processing space.

8. The method of one of claims 1 and 2, further comprising flowing at least a part of said gas or gas mixture into said cavity and from said cavity via a pressure stage into said processing space.

9. The method of claim 1, comprising sustaining said plasma discharge by a supply voltage of at most 200 V.

10. The method of claim 9, said voltage being selected to be at most 100 V.

11. The method of claim 1, wherein said treating of said surface comprises coating.

12. The method according to claim 11, wherein said treating of said surface comprises coating with a material comprising at least one of a nitride, a boride, a carbide, an oxide of a metal or mixtures thereof.

13. The method of claim 12, wherein said metal comprises or consists of aluminum.

14. The method of claim 1, further comprising establishing said plasma discharge as one of a cathodic arc discharge and of a glow discharge making use of a hot filament cathode.

15. The method of claim 1 comprising cooling said anode by a cooling medium flowing through a cooling medium channel system in said anode.

16. A method for manufacturing a treated surface comprising
providing a processing space within a vacuum recipient, therein an anode with a metal anode surface having an extended surface with at least one cavity, which cavity is open to said processing space, and wherein the smallest cross sectional width W of said cavity is between 3 mm and 100 mm and the depth T of said cavity is at least half the width W, and a cathode, said metal anode surface establishing a first specific DC impedance;

establishing in said processing space an atmosphere of a gas or of a gas mixture at a desired pressure or at desired partial pressures;

generating a plasma discharge in said processing space by applying between said anode and said cathode an electric supply signal comprising a DC component;

treating a surface with the help of said plasma discharge, thereby generating in said processing space a solid having a second specific electric DC impedance which is higher than said first specific DC impedance;

establishing at least one area of said anode surface shielded from said solid by generating a distinct shielding plasma on said at least one area, the extent of which being substantially limited to said at least one area, and ensuring automatic ignition of the distinct shielding plasma in a prevailing set of process parameters in the processing space by variably controlling a flow of the gas or the gas mixture through the cavity into the processing space, wherein the prevailing set of process parameters comprises:

the smallest cross sectional width W of the cavity and the depth T of said cavity;

the atmosphere of the gas or of the gas mixture at the desired pressure or at the desired partial pressures;

the first specific DC impedance;

the electric supply signal comprising the DC component; and the second specific electric DC impedance.

* * * * *